United States Patent
Omura et al.

(10) Patent No.: US 9,831,400 B2
(45) Date of Patent: Nov. 28, 2017

(54) LIGHT-EMITTING APPARATUS AND ILLUMINATION APPARATUS

(71) Applicant: Panasonic Intellectual Property Management Co., Ltd., Osaka (JP)

(72) Inventors: Koji Omura, Osaka (JP); Masumi Abe, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/247,454

(22) Filed: Aug. 25, 2016

(65) Prior Publication Data

US 2017/0062670 A1 Mar. 2, 2017

(30) Foreign Application Priority Data

Sep. 2, 2015 (JP) .................................. 2015-173343

(51) Int. Cl.
*H01L 33/50* (2010.01)
*H01L 33/52* (2010.01)
*H01L 27/15* (2006.01)

(52) U.S. Cl.
CPC .......... *H01L 33/507* (2013.01); *H01L 27/156* (2013.01); *H01L 33/52* (2013.01)

(58) Field of Classification Search
CPC .................... H01L 33/507; H01L 33/52; H01L 27/15–27/156; H01L 2933/00–2933/0091
See application file for complete search history.

(56) References Cited

U.S. PATENT DOCUMENTS

| 2014/0232289 A1* | 8/2014 | Brandes | H05B 33/086 315/250 |
| 2015/0155459 A1* | 6/2015 | Ishihara | H01L 25/0753 362/294 |

FOREIGN PATENT DOCUMENTS

JP 2011-146640 A 7/2011

* cited by examiner

*Primary Examiner* — Hoang-Quan Ho
(74) *Attorney, Agent, or Firm* — McDermott Will & Emery LLP

(57) ABSTRACT

A light-emitting apparatus includes: a substrate; a plurality of LED chips disposed on the substrate and including a plurality of blue LED chips which emit blue light and a plurality of red LED chips which emit red light; and a sealing member that contains a yellow phosphor and seals the plurality of LED chips together. The plurality of LED chips include: a first LED chip group made up of the blue LED chips; a second LED chip group made up of the red LED chips and disposed around the first LED chip group in an annular shape centered on an optical axis; and a third LED chip group made up of the blue LED chips and disposed around the second LED chip group in an annular shape centered on the optical axis.

6 Claims, 6 Drawing Sheets

LIGHT-EMITTING APPARATUS AND ILLUMINATION APPARATUS

CROSS REFERENCE TO RELATED APPLICATION

This application claims the benefit of priority of Japanese Patent Application Number 2015-173343 filed on Sep. 2, 2015, the entire content of which is hereby incorporated by reference.

BACKGROUND

1. Technical Field

The present disclosure relates to a light-emitting apparatus including a light-emitting element, such as an LED (light-emitting diode), and an illumination apparatus including the light-emitting apparatus.

2. Description of the Related Art

Semiconductor light-emitting elements such as LEDs (light-emitting diodes) are widely used as efficient, space-saving light sources in various illumination apparatuses for lighting purposes, display purposes, and so on.

A COB (chip-on-board) light-emitting apparatus (a light-emitting module) in which a blue LED chip mounted on a substrate is sealed with a sealing member formed of a light-transmissive resin containing a phosphor is known (for example, see Japanese Unexamined Patent Application Publication No. 2011-146640).

SUMMARY

One of the purposes for the above light-emitting apparatus is to reduce the effect heat generated by the phosphor emitting light has on the sealing member.

In view of this, the present disclosure provides a light-emitting apparatus and an illumination apparatus that are capable of reducing the effect heat generated by the phosphor emitting light has on the sealing member.

A light-emitting apparatus according to an aspect of the present disclosure includes: a substrate; a plurality of light-emitting elements disposed on the substrate and including a plurality of first light-emitting elements which emit light that excites a phosphor and a plurality of second light-emitting elements which emit light that does not excite the phosphor; and a sealing member that contains the phosphor and seals the plurality of light-emitting elements together, wherein the plurality of light-emitting elements include: a first light-emitting element group; a second light-emitting element group disposed around the first light-emitting element group in an annular shape centered on an optical axis of the light-emitting apparatus; and a third light-emitting element group disposed around the second light-emitting element group in an annular shape centered on the optical axis, a total number of the first light-emitting elements included in the first light-emitting element group is greater than a total number of the second light-emitting elements included in the first light-emitting element group, a total number of the second light-emitting elements included in the second light-emitting element group is greater than a total number of the first light-emitting elements included in the second light-emitting element group, and a total number of the first light-emitting elements included in the third light-emitting element group is greater than a total number of the second light-emitting elements included in the third light-emitting element group.

An illumination apparatus according to an aspect of the present disclosure includes: the light-emitting apparatus described above; and a lighting apparatus that supplies the light-emitting apparatus with electric power for lighting the light-emitting apparatus.

The light-emitting apparatus and the illumination apparatus according to the present disclosure are capable of reducing the effect of heat on the sealing member.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, a light-emitting apparatus, etc., according to embodiments are described with reference to the Drawings. Note that each of the embodiments described below shows a general or specific example. The numerical values, shapes, materials, structural elements, the arrangement and connection of the structural elements, steps, the processing order of the steps, etc., shown in the following embodiments are mere examples, and are not intended to limit the scope of the present disclosure. As such, among the structural elements in the following embodiments, those not recited in any one of the independent claims which indicate the broadest inventive concepts are described as arbitrary structural elements.

Furthermore, the respective figures are schematic illustrations and are not necessarily precise illustrations. Additionally, substantially identical elements are assigned the same reference signs, and there are cases where overlapping descriptions are omitted or simplified.

Embodiment 1

Configuration

Figure 1:
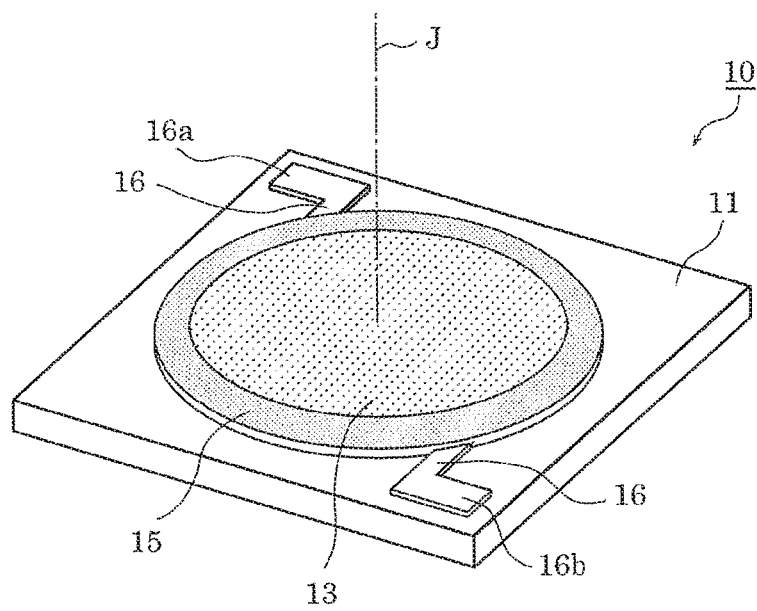
FIG. 1 is a perspective view of an external appearance of a light-emitting apparatus according to Embodiment 1.
Figure 2:
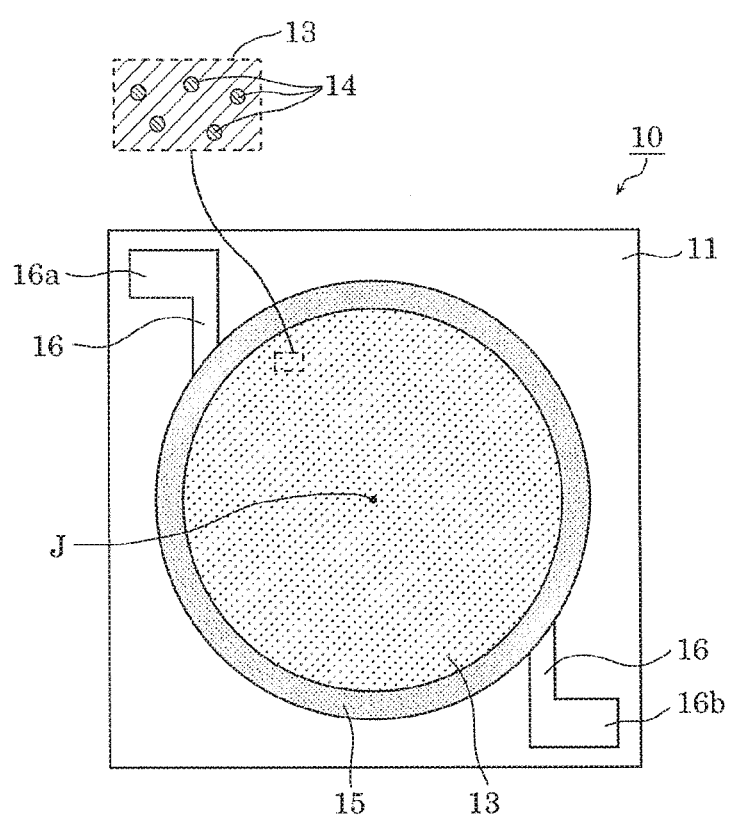
FIG. 2 is a plan view of a light-emitting apparatus according to Embodiment 1.
Figure 3:
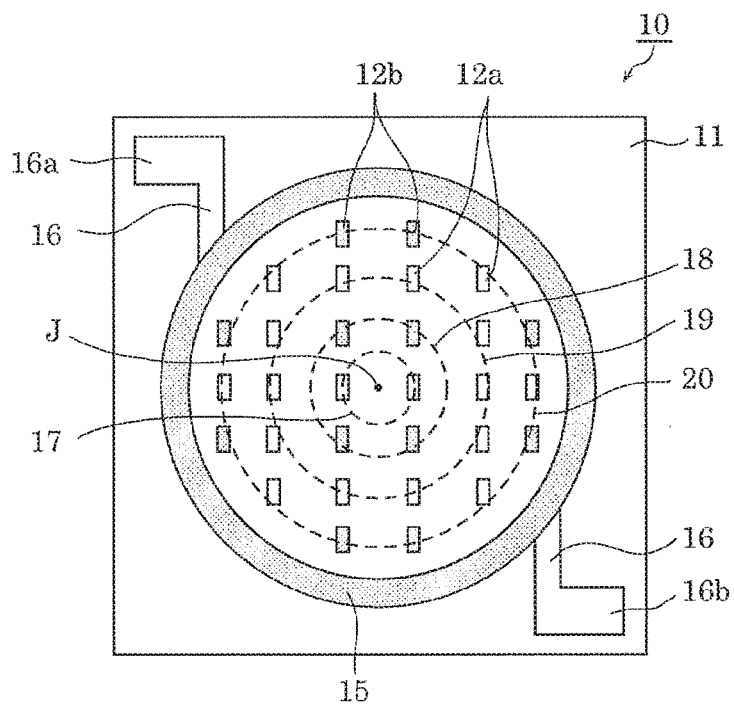
FIG. 3 is a plan view of a light-emitting apparatus according to Embodiment 1, illustrating the arrangement of a plurality of LED chips included therein.

First, the configuration of the light-emitting apparatus according to Embodiment 1 will be described with reference to the Drawings. FIG. 1 is a perspective view of an external appearance of a light-emitting apparatus according to Embodiment 1. FIG. 2 is a plan view of a light-emitting apparatus according to Embodiment 1. FIG. 3 is a plan view of a light-emitting apparatus according to Embodiment 1, illustrating the arrangement of a plurality of LED chips included therein.

FIG. 2 includes an enlarged cross-sectional view of the internal structure of a sealing member (which is a schematic view; the portion enclosed by a dashed frame in FIG. 2). In FIG. 3, the illustration of a sealing member which seals a plurality of LED chips is omitted in order that the arrangement of the plurality of LED chips is illustrated.

Light-emitting apparatus 10 according to Embodiment 1 includes substrate 11, a plurality of LED chips 12, sealing member 13, and dam member (side sealing member) 15 as illustrated in FIG. 1 to FIG. 3. The plurality of LED chips include two or more blue LED chips 12a and two or more red LED chips 12b. In addition, optical axis J of light-emitting apparatus 10 (the center of light emission) is illustrated in FIG. 1 to FIG. 3.

Light-emitting apparatus 10 is what is called a COB (chip-on-board) LED module in which the plurality of LED chips are directly mounted on substrate 11.

Substrate 11 is a rectangular substrate on which the plurality of LED chips, and electrode 16a, electrode 16b, and wiring 16 for supplying electric power to the plurality of LED chips are provided. The shape of substrate 11 may be a circle or another shape. Substrate 11 is, for example, a metal-based substrate or a ceramic substrate. Furthermore, substrate 11 may be a resin substrate that uses a resin as a base material.

An alumina substrate made of aluminum oxide (alumina), an aluminum nitride substrate made of aluminum nitride, or the like is used as the ceramic substrate. An aluminum alloy substrate, an iron alloy substrate, a copper alloy substrate, or the like, the surface of which is coated with an insulating film, for example, is used as the metal-based substrate. A glass-epoxy substrate made of glass fiber and an epoxy resin is used as the resin substrate, for example.

Note that a substrate having a high optical reflectivity (for example, an optical reflectivity of 90% or higher), for example, may be used as substrate 11. Using a substrate having a high optical reflectivity as substrate 11 allows light emitted by LED chips 12 to be reflected off the surface of substrate 11. This results in an increase in the light extraction rate of light-emitting apparatus 10. Examples of the substrate include a white ceramic substrate that uses alumina as a base material.

Alternatively, a light-transmissive substrate having high light transmittance may be used as substrate 11. Examples of the substrate include a light-transmissive ceramic substrate made of polycrystalline alumina or aluminum nitride, a clear glass substrate made of glass, a crystal substrate made of crystal, a sapphire substrate made of sapphire, or a transparent resin substrate made of a transparent resin material.

Wiring 16, electrode 16a, and electrode 16b are metal wiring for supplying electric power to the plurality of LED chips. With DC power supplied between electrode 16a and electrode 16b, light-emitting apparatus 10 (a plurality of LED chips) emits light. Wiring 16, electrode 16a, and electrode 16b are formed of gold, silver, copper, or the like, for example. Note that detailed illustration of a wiring pattern to each LED chip is omitted in FIG. 3.

The plurality of LED chips may be electrically connected in any way so long as they are capable of emitting light with DC power supplied between electrode 16a and electrode 16b. For example, a plurality of light-emitting element lines including a plurality of LED chips connected in series are connected in parallel between electrode 16a and electrode 16b. In this case, the total number of blue LED chips 12a and the total number of red LED chips 12b in one light-emitting element line are preferably equal to the total number of blue LED chips 12a and the total number of red LED chips 12b in another light-emitting element line. This is because this results in total Vf of one light-emitting element line and total Vf of another light-emitting element line being equal. Note that a bonding wire, for example, is used to electrically connect the LED chips to each other and electrically connect the LED chips to the wiring pattern.

Blue LED chip 12a is one example of a first light-emitting element and emits blue light. Blue LED chip 12a is formed using an InGaN-based material, for example. The peak wavelength (central wavelength) of the light emission of blue LED chip 12a is in the range from 430 nm to 480 nm, for example. The blue light which blue LED chip 12a emits can excite yellow phosphor 14.

Red LED chip 12b is one example of a second light-emitting element and emits red light. Red LED chip 12b is formed using an AlGaInP-based material, for example. The peak wavelength of the light emission of red LED chip 12b is in the range from 600 nm to 660 nm, for example. The red light emitted from red LED chip 12b does not excite yellow phosphor 14.

Dam member 15 is provided on substrate 11 and serves to block sealing member 13. For example, a thermosetting resin or a thermoplastic resin having an insulating property is used as dam member 15. More specifically, a silicone resin, a phenol resin, an epoxy resin, a BT (bismaleimide-triazine) resin, PPA (polyphthalamide), or the like is used as dam member 15.

It is desirable that dam member 15 have the property of reflecting light in order to increase the light extraction rate of light-emitting apparatus 10. Thus, a resin in a white color (what is called a white resin) is used as dam member 15 in Embodiment 1. Note that in order to increase the light-reflecting property of dam member 15, $TiO_2$, $Al_2O_3$, $ZrO_2$, MgO, and the like particles may be contained in dam member 15.

In light-emitting apparatus 10, dam member 15 is formed in a circular annular shape so as to laterally surround a plurality of LED chips in a plan view (top view). Sealing member 13 is provided in a region surrounded by dam member 15. This means that dam member 15 laterally surrounds the plurality of LED chips and sealing member 13. With this configuration, it is possible to increase the light extraction rate of light-emitting apparatus 10.

Sealing member 13 contains yellow phosphor 14 and seals the plurality of LED chips together. Sealing member 13 has light-diffusing properties. Specifically, sealing member 13 is formed of a light-transmissive resin material containing yellow phosphor 14 as a wavelength converting element. As the light-transmissive resin material, a methyl-based silicone resin is used, for example, but an epoxy resin, a urea resin, or the like may be used.

Yellow phosphor 14 is one example of a phosphor (phosphor particles) and is excited by the light emitted from blue LED chip 12a and emits yellow light. For example, an yttrium aluminum garnet (YAG)-based phosphor is used as yellow phosphor 14. The peak wavelength of fluorescence of yellow phosphor 14 is in the range from 550 nm to 570 nm, for example.

In light-emitting apparatus 10, the wavelength of a portion of the blue light emitted from blue LED chip 12a is converted by yellow phosphor 14 contained in sealing member 13, so that the portion is transformed into yellow light. Then, the blue light not absorbed by yellow phosphor 14, the red light emitted from red LED chip 12b, and the yellow light resulting from the wavelength conversion by yellow phosphor 14 are diffused and mixed within sealing member 13. Consequently, white light is emitted from sealing member 13.

Note that sealing member 13 may contain a green phosphor instead of or in addition to yellow phosphor 14. Specifically, the green phosphor is a $Y_3(Al, Ga)_5O_{12}:Ce^{3+}$ phosphor or a $Lu_3Al_5O_{12}:Ce^{3+}$ phosphor having a peak wavelength of the fluorescence in the range from 515 nm to 550 nm, for example.

Next, one example of the method of manufacturing light-emitting apparatus 10 is briefly described. In the manufacture of light-emitting apparatus 10, first, dam member 15 is formed in an annular shape on substrate 11, and then the plurality of LED chips are mounted in the region surrounded by dam member 15. A die-attach material or the like is used to mount the plurality of LED chips by die bonding. Furthermore, LED chips are electrically connected to each other by bonding wires and so on. Subsequently, sealing member 13 fills (is applied to) the region surrounded by dam member 15, and then is cured by heat, light radiation, or the like.

Arrangement of LED Chips

One of the features of light-emitting apparatus 10 is an arrangement of LED chips. The following describes the arrangement of LED chips in light-emitting apparatus 10 with reference to FIG. 3.

Each of the LED chips mounted on substrate 11 is aligned with another LED chip along the long side thereof and the short side thereof. Each of the LED chips emits light mainly toward sealing member 13.

The LED chips include first LED chip group 17, second LED chip group 18, third LED chip group 19, and fourth LED chip group 20. In the descriptions of the following embodiments, it is assumed that a plurality of LED chips located on one annular dashed line constitute one LED chip group.

First LED chip group 17 is one example of a first light-emitting element group and is at the innermost position among the plurality of LED chips disposed on substrate 11. First LED chip group 17 is made up of two blue LED chips 12a. This means that first LED chip group 17 includes only blue LED chip 12a among blue LED chip 12a and red LED chip 12b. The total number of blue LED chips 12a included in first LED chip group 17 only needs to be greater than the total number of red LED chips 12b included in first LED chip group 17. Thus, red LED chip 12b may be included in first LED chip group 17.

Second LED chip group 18 is one example of a second light-emitting element group and is disposed around first LED chip group 17 in an annular shape centered on optical axis J of light-emitting apparatus 10. In other words, second LED chip group 18 is disposed in an annular shape concentric with first LED chip group 17.

Second LED chip group 18 is adjacent to first LED chip group 17. This means that there are no other LED chips between second LED chip group 18 and first LED chip group 17.

Second LED chip group 18 is made up of four red LED chips 12b. This means that second LED chip group 18 includes only red LED chip 12b among blue LED chip 12a and red LED chip 12b. The total number of red LED chips 12b included in second LED chip group 18 only needs to be greater than the total number of blue LED chips 12a included in second LED chip group 18, and blue LED chip 12a may be included in second LED chip group 18.

Third LED chip group 19 is one example of a third light-emitting element group and is disposed around second LED chip group 18 in an annular shape centered on optical axis J of light-emitting apparatus 10. Third LED chip group 19 is adjacent to second LED chip group 18. This means that there are no other LED chips between third LED chip group 19 and second LED chip group 18.

Third LED chip group 19 is made up of 10 blue LED chips 12a. This means that third LED chip group 19 includes only blue LED chip 12a among blue LED chip 12a and red LED chip 12b. The total number of blue LED chips 12a included in third LED chip group 19 only needs to be greater than the total number of red LED chips 12b included in third LED chip group 19, and red LED chip 12b may be included in third LED chip group 19.

Fourth LED chip group 20 is at the outermost position among the plurality of LED chips disposed on substrate 11. Fourth LED chip group 20 is disposed around third LED chip group 19 in an annular shape centered on optical axis J of light-emitting apparatus 10. In other words, fourth LED chip group 20 is disposed in an annular shape concentric with third LED chip group 19.

Fourth LED chip group 20 is adjacent to third LED chip group 19. This means that there are no other LED chips between fourth LED chip group 20 and third LED chip group 19.

Fourth LED chip group 20 is made up of six blue LED chips 12a and eight red LED chips 12b. Thus, the total number of red LED chips 12b included in fourth LED chip group 20 is greater than the total number of blue LED chips 12a included in fourth LED chip group 20. Fourth LED chip group 20 may include only red LED chip 12b among blue LED chip 12a and red LED chip 12b.

As just described, the plurality of LED chip groups are disposed on substrate 11 included in light-emitting apparatus 10. Each of the LED chip groups other than first LED chip group 17 is of the annular shape centered on optical axis J. On substrate 11, an LED chip group (second LED chip group 18) made up of mainly red LED chips 12b is disposed between two LED chip groups (first LED chip group 17 and third LED chip group 19) each of which is made up of mainly blue LED chips 12a. In other words, on substrate 11, an LED chip group made up of mainly blue LED chips 12a and an LED chip group made up of mainly red LED chips 12b are disposed alternately: each of them is disposed every other circle.

Note that in light-emitting apparatus 10, the total number of LED chips included in the LED chip group located in an outer area (at a position farther from optical axis J) is greater.

Advantageous Effects

A goal for a light-emitting apparatus in which only blue LED chip 12a is sealed with sealing member 13 (a light-emitting apparatus that does not include red LED chip 12b which is hereinafter also referred to as a light-emitting apparatus according to a comparative example) is to reduce the effect heat generated by yellow phosphor 14 emitting light has on sealing member 13 while the light-emitting apparatus is ON.

In this regard, the LED chips included in light-emitting apparatus 10 include not only blue LED chip 12a but also red LED chip 12b, and are disposed in concentric annular shapes as described above.

The red light emitted from red LED chip 12b does not excite yellow phosphor 14. Therefore, yellow phosphor 14 in an upper portion of sealing member 13 above red LED chip 12b is less likely to emit light and thus generates less heat than that in an upper portion of sealing member 13 above blue LED chip 12a.

In other words, a portion of sealing member 13 above second LED chip group 18 (which is hereinafter also referred to as a second portion) generates less heat than a portion of sealing member 13 above first LED chip group 17 (which is hereinafter also referred to as a first portion) and a portion of sealing member 13 above third LED chip group 19 (which is hereinafter also referred to as a third portion). This allows heat generated in the first portion and the third portion to be transferred to the second portion, that is, allows the first portion and the third portion to have improved heat dissipation. The heat generated in the third portion can be transferred also to a portion of sealing member 13 above fourth LED chip group 20. Thus, the effect the heat generated by yellow phosphor 14 emitting light has on sealing member 13 (thermal load) can be reduced.

Particularly, in the light-emitting apparatus according to the comparative example, sealing member 13 tends to have high heat generation density at a central portion (around optical axis J). A temperature increase at the central portion to an excessively high level is not desirable because it results in stress on the central portion and stress on a peripheral portion of the sealing member being different from each other due to a temperature difference between the central portion and the peripheral portion, which may cause disconnection of the bonding wire used to connect the LED chips.

In contrast, in light-emitting apparatus 10, the area where a large amount of heat is generated is not continuous outward from the central portion of sealing member 13, and therefore it is easy to transfer heat at the central portion of sealing member 13 outward. In other words, the effect of heat generation by yellow phosphor 14 at the central portion of sealing member 13 can be reduced. In addition, red LED chip 12b produces the advantageous effect of increasing color rendering properties of the white light which light-emitting apparatus 10 emits.

In order to reduce the effect of heat generation by yellow phosphor 14 at the central portion of sealing member 13, the total number of red LED chips 12b on substrate 11 around optical axis J may be increased. Specifically, the LED chip group located at the innermost position among the plurality of LED chips may be made up of mainly red LED chips 12b. However, in this case, the white light emitted from light-emitting apparatus 10 sometimes has a dark red color at the center, which may cause color unevenness to stand out. If there is such a concern, the LED chip group located at the innermost position among the plurality of LED chips may be made up of mainly blue LED chips 12a.

Note that the total number of blue LED chips 12a and the total number of red LED chips 12b in light-emitting apparatus 10 are not particularly limited; they may be changed as appropriate according to, for example, the color temperature of the white light which light-emitting apparatus 10 emits. For example, in light-emitting apparatus 10, the ratio of the total number of blue LED chips 12a to the total number of red LED chips 12b is 3 to 2, but may be 2 to 1.

Variation 1

The LED chip group may be disposed in a circular annular shape. The following describes a light-emitting apparatus in which the LED chip group is disposed in a circular annular shape as Variation 1. Note that there are cases where the descriptions already given in Embodiment 1 above are not repeated.

Figure 4:
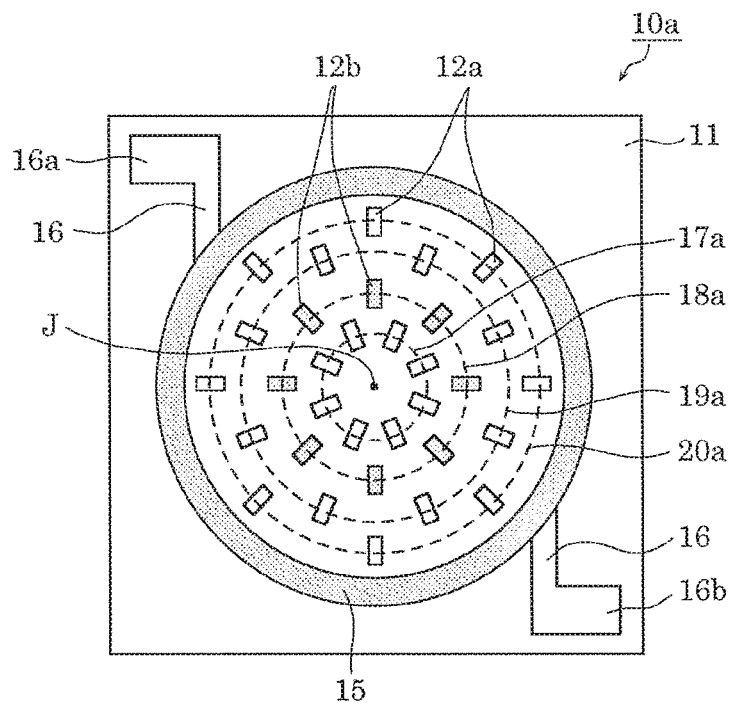
FIG. 4 is a plan view of a light-emitting apparatus according to Variation 1, illustrating the arrangement of a plurality of LED chips included therein.

FIG. 4 is a plan view of a light-emitting apparatus according to Variation 1, illustrating the arrangement of a plurality of LED chips included therein. Note that in FIG. 4, illustration of sealing member 13, a detailed wiring pattern on substrate 11, the bonding wire, and other elements is omitted.

A plurality of LED chips are mounted on substrate 11 of light-emitting apparatus 10a illustrated in FIG. 4. Each of the LED chips emits light mainly toward sealing member 13. The LED chips include a plurality of LED chip groups each made up of two or more LED chips (eight LED chips herein) arranged in a circular annular shape. Each of the LED chips constituting one LED chip group is positioned in such a way that the long side of the LED chip extends along the radial direction and the short side of the LED chip extends along the circumferential direction. Note that each of the LED chips constituting one LED chip group may be positioned in such a way that the short side of the LED chip extends along the radial direction and the long side of the LED chip extends along the circumferential direction.

Specifically, the plurality of LED chip groups include first LED chip group 17a, second LED chip group 18a, third LED chip group 19a, and fourth LED chip group 20a.

First LED chip group 17a is one example of the first light-emitting element group and is at the innermost position among the plurality of LED chips disposed on substrate 11 and is disposed in a circular annular shape centered on optical axis J of light-emitting apparatus 10a. First LED chip group 17a is made up of blue LED chip 12a only.

Second LED chip group 18a is one example of the second light-emitting element group and is disposed around first LED chip group 17a in a circular annular shape centered on optical axis J. Second LED chip group 18a is made up of red LED chip 12b only.

Third LED chip group 19a is one example of the third light-emitting element group and is disposed around second LED chip group 18a in a circular annular shape centered on optical axis J. In other words, second LED chip group 18a and third LED chip group 19a are disposed in concentric circles centered on optical axis J. Third LED chip group 19a is made up of blue LED chip 12a only.

Fourth LED chip group 20a is at the outermost position among the plurality of LED chips disposed on substrate 11 and is disposed around third LED chip group 19a in a circular annular shape centered on optical axis J. Third LED chip group 19a is made up of blue LED chip 12a only.

Such light-emitting apparatus 10a is also capable of reducing the effect the heat generated by yellow phosphor 14 emitting light has on sealing member 13 (thermal load), for the same or similar reasons as light-emitting apparatus 10.

Note that when light-emitting apparatus 10a emits white light, there is a tendency that the total number of blue LED chips 12a is greater than the total number of red LED chips 12b. Therefore, as in light-emitting apparatus 10a, third LED chip group 19a made up of blue LED chip 12a only (or in which the total number of blue LED chips 12a is greater than the total number of red LED chips 12b) may be adjacent to fourth LED chip group 20a. As such, it is not essential that an LED chip group in which the total number of blue LED chips 12a is greater than the total number of red LED chips 12b and an LED chip group in which the total number of red LED chips 12b is greater than the total number of blue LED chips 12a are disposed alternately; each of them is disposed every other circle.

When the outermost LED chip group among the LED chip groups is made up of mainly red LED chip 12b as in light-emitting apparatus 10, a peripheral portion of the white light emitted from light-emitting apparatus 10 has a dark red color, which may cause color unevenness to stand out. If there is such a concern, the outermost LED chip group among the LED chip groups may be made up of mainly blue LED chip 12a as in light-emitting apparatus 10a.

Variation 2

The LED chip group may be disposed in a rectangular annular shape. Furthermore, the dam member may also be disposed in a rectangular annular shape. The following describes a light-emitting apparatus in which the LED chip group is disposed in a rectangular annular shape as Variation 2. Note that there are cases where the descriptions already given in Embodiment 1 above are not repeated.

Figure 5:
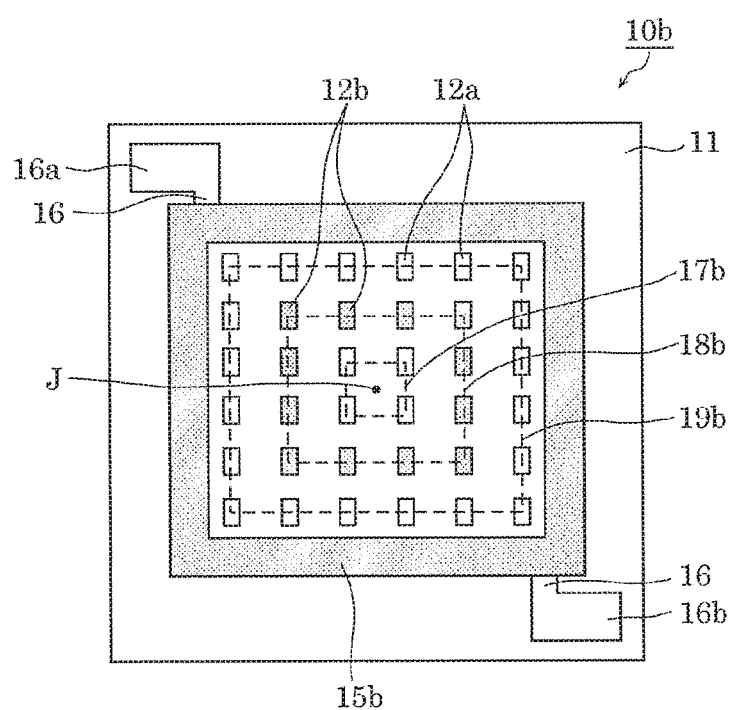
FIG. 5 is a plan view of a light-emitting apparatus according to Variation 2, illustrating the arrangement of a plurality of LED chips included therein.

FIG. 5 is a plan view of a light-emitting apparatus according to Variation 2, illustrating the arrangement of a plurality of LED chips included therein. Note that in FIG. 5, illustration of sealing member 13, a detailed wiring pattern, the bonding wire, and other elements is omitted.

On substrate 11 of light-emitting apparatus 10b illustrated in FIG. 5, dam member 15b is formed in a rectangular annular shape, and a plurality of LED chips are mounted in a region surrounded by dam member 15b. Each of the LED chips mounted on substrate 11 is aligned with another LED chip along the long side thereof and the short side thereof. Each of the LED chips emits light mainly toward sealing member 13.

The LED chips include a plurality of LED chip groups each made up of two or more LED chips arranged in a rectangular annular shape. Specifically, the plurality of LED chip groups include first LED chip group 17b, second LED chip group 18b, and third LED chip group 19b.

First LED chip group 17b is one example of the first light-emitting element group and is at the innermost position among the plurality of LED chips disposed on substrate 11 and is disposed in a rectangular annular shape centered on optical axis J of light-emitting apparatus 10b. First LED chip group 17b is made up of four blue LED chips 12a. This means that first LED chip group 17b is made up of blue LED chip 12a only.

Second LED chip group 18a is one example of the second light-emitting element group and is disposed around first LED chip group 17b in a rectangular annular shape centered on optical axis J. Second LED chip group 18b is made up of 12 red LED chips 12b. This means that second LED chip group 18b is made up of red LED chip 12b only.

Third LED chip group 19b is one example of the third light-emitting element group and is at the outermost position among the plurality of LED chips disposed on substrate 11. Third LED chip group 19b is disposed around second LED chip group 18b in a rectangular annular shape centered on optical axis J. Third LED chip group 19b is made up of 20 blue LED chips 12a. This means that third LED chip group 19b is made up of blue LED chip 12a only.

In light-emitting apparatus 10b, the total number of LED chips included in the LED chip group located in an outer area (at a position farther from optical axis J) is greater.

Such light-emitting apparatus 10b is also capable of reducing the effect the heat generated by yellow phosphor 14 emitting light has on sealing member 13, for the same or similar reasons as light-emitting apparatus 10.

Summary of Embodiment 1

As described above, light-emitting apparatus 10 includes: substrate 11; and a plurality of LED chips disposed on substrate 11 and including a plurality of blue LED chips 12a which emit light that excites yellow phosphor 14 and a plurality of red LED chips 12b which emit light that does not excite yellow phosphor 14. Furthermore, light-emitting apparatus 10 includes sealing member 13 that contains yellow phosphor 14 and seals the plurality of LED chips together. The plurality of LED chips include: first LED chip group 17; second LED chip group 18 disposed around first LED chip group 17 in an annular shape centered on optical axis J of light-emitting apparatus 10; and third LED chip group 19 disposed around second LED chip group 18 in an annular shape centered on optical axis J. Blue LED chip 12a is one example of the first light-emitting element, red LED chip 12b is one example of the second light-emitting element, and yellow phosphor 14 is one example of the phosphor. First LED chip group 17 is one example of the first light-emitting element group, second LED chip group 18 is one example of the second light-emitting element group, and third LED chip group 19 is one example of the third light-emitting element group.

The total number of blue LED chips 12a included in first LED chip group 17 is greater than the total number of red LED chips 12b included in first LED chip group 17. The total number of red LED chips 12b included in second LED chip group 18 is greater than the total number of blue LED chips 12a included in second LED chip group 18. The total number of blue LED chips 12a included in third LED chip group 19 is greater than the total number of red LED chips 12b included in third LED chip group 19.

In light-emitting apparatus 10, as a result of having second LED chip group 18 including a great number of red LED chips 12b which do not excite yellow phosphor 14 as just described, the area where yellow phosphor 14 generates a large amount of heat is not continuous outward from the central portion of sealing member 13. Thus, light-emitting apparatus 10 is capable of reducing the effect the heat generated by yellow phosphor 14 emitting light has on sealing member 13.

Furthermore, first LED chip group 17 may be at the innermost position among the plurality of LED chips disposed on substrate 11, and among blue LED chip 12a and red LED chip 12b, only blue LED chip 12a may be included in first LED chip group 17.

With this, light-emitting apparatus 10 is capable of transferring heat outward that is likely to accumulate at a central portion. In addition, it is possible to reduce color unevenness of the light which light-emitting apparatus 10 emits that would appear at a central portion of the light.

Furthermore, third LED chip group 19 may be at the outermost position among the plurality of LED chips disposed on substrate 11, and among blue LED chip 12a and red LED chip 12b, only blue LED chip 12a may be included in third LED chip group 19.

With this, it is possible to reduce color unevenness of the light which light-emitting apparatus 10 emits that would appear at a peripheral portion of the light.

Furthermore, among blue LED chip 12a and red LED chip 12b, only red LED chip 12b may be included in second LED chip group 18.

This allows the temperature of sealing member 13 located above second LED chip group 18 to decrease more than when blue LED chip 12a is included as a part of second LED chip group 18.

Furthermore, just as in light-emitting apparatus 10a, each of second LED chip group 18a and third LED chip group 19a may be disposed in a circular annular shape on substrate 11, and second LED chip group 18a and third LED chip group 19a may be disposed in concentric circles centered on optical axis J.

With this, light-emitting apparatus 10a including a plurality of LED chip groups disposed in concentric circles is also capable of reducing the effect the heat generated by yellow phosphor 14 emitting light has on sealing member 13.

Furthermore, as described above, blue LED chip 12a is one example of the first light-emitting element, red LED chip 12b is one example of the second light-emitting element, and yellow phosphor 14 is one example of the phosphor. In other words, the first light-emitting element may be blue LED chip 12a which emits blue light, the second light-emitting element may be rod LED chip 12b which emits red light, and the phosphor may be yellow phosphor 14 (or a green phosphor).

With this, light-emitting apparatus 10 is capable of emitting white light.

Furthermore, light-emitting apparatus 10 may further include dam member 15 that is disposed on substrate 11, blocks sealing member 13, and laterally surrounds sealing member 13.

With this, it is possible to reduce leaking light which is output in a lateral direction of sealing member 13.

Embodiment 2

Configuration of Illumination Apparatus

Figure 6:
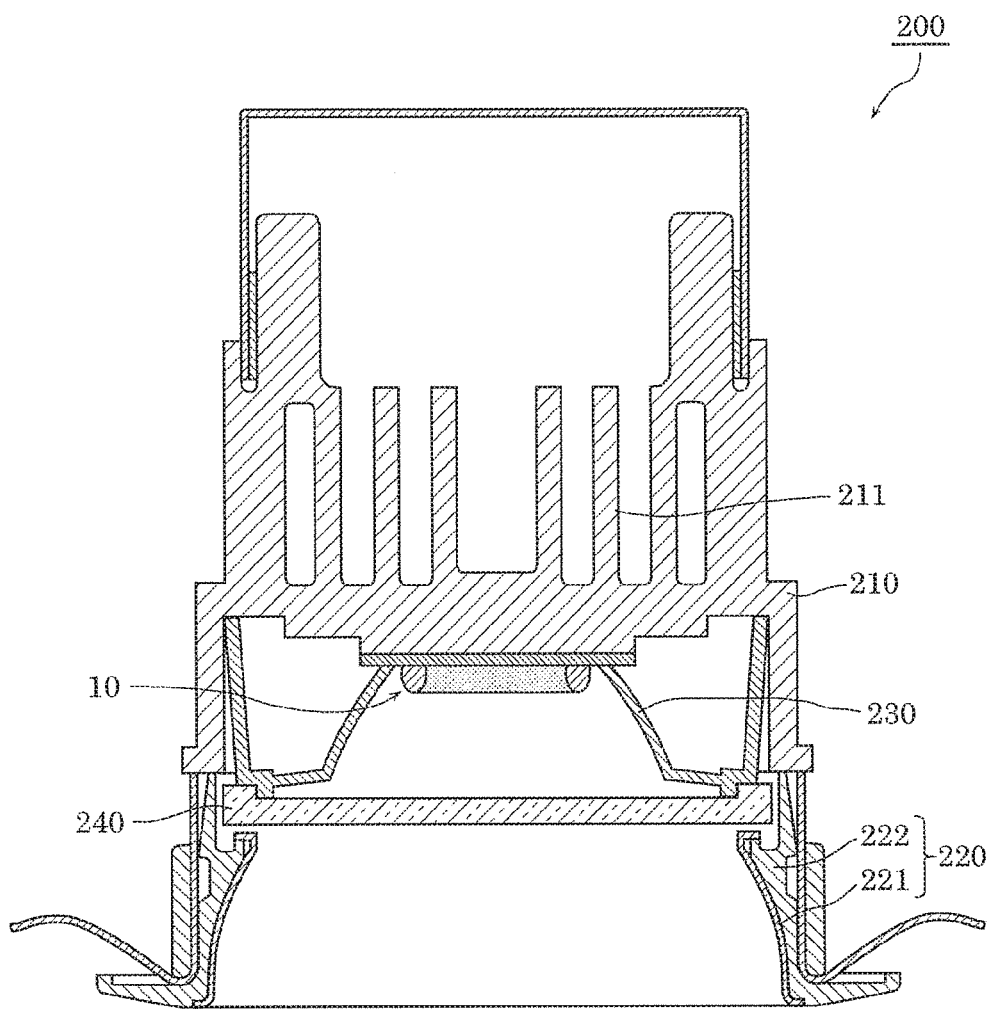
FIG. 6 is a cross-sectional view of an illumination apparatus according to Embodiment 2.
Figure 7:
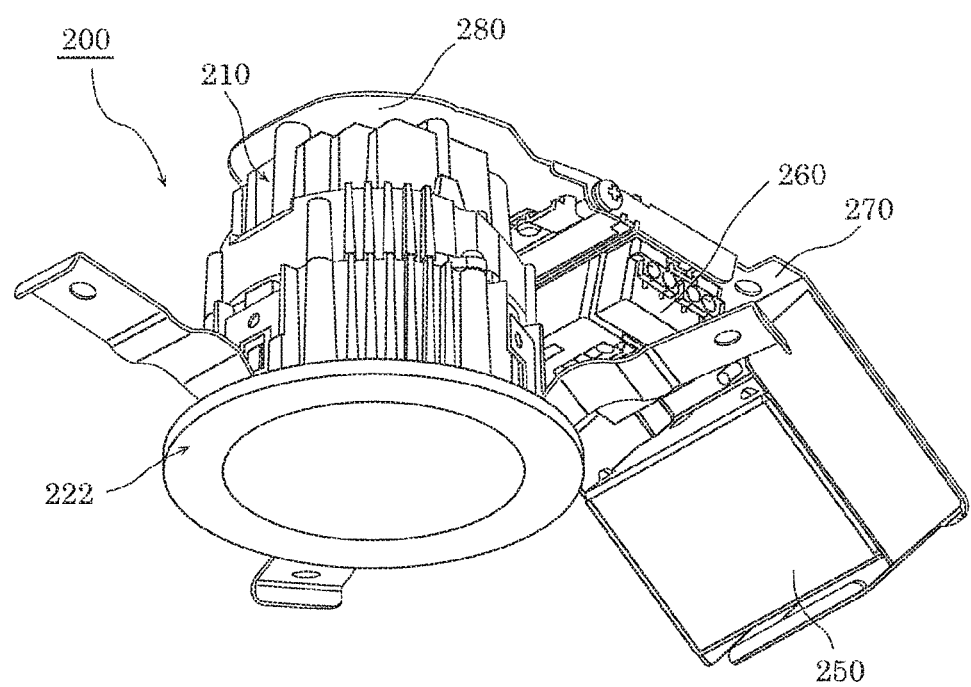
FIG. 7 is a perspective view of external appearances of an illumination apparatus and peripheral members thereof according to Embodiment 2.

In Embodiment 2, an illumination apparatus including light-emitting apparatus 10 according to Embodiment 1 is described. FIG. 6 is a cross-sectional view of an illumination apparatus according to Embodiment 2. FIG. 7 is a perspective view of external appearances of an illumination apparatus and peripheral members thereof according to Embodiment 2.

As illustrated in FIG. 6 and FIG. 7, illumination apparatus 200 according to Embodiment 2 is a sunken illumination apparatus, such as a recessed light, that emits light downward (toward the floor or a wall, for example) by being installed, for example, in the ceiling of a house.

Illumination apparatus 200 includes light-emitting apparatus 10. Illumination apparatus 200 further includes an apparatus body in the shape of a substantial bottomed tube formed by joining pedestal 210 and frame 220, and reflection plate 230 and light-transmissive panel 240 disposed on this apparatus body.

Pedestal 210 is an attachment base to which light-emitting apparatus 10 is attached, and also serves as a heat sink for dissipating heat generated by light-emitting apparatus 10. Pedestal 210 is formed into a substantially columnar shape using a metal material and is, in Embodiment 2, made of die-cast aluminum.

Two or more heat-dissipating fins 211 are provided at predetermined intervals along one direction on the top portion (ceiling-side portion) of pedestal 210 so as to protrude upward. With this, heat generated by light-emitting apparatus 10 can be efficiently dissipated.

Frame 220 includes: cone portion 221 including a reflective surface on an inner surface and having a substantially circular tube shape; and frame body 222 to which cone portion 221 is attached. Cone portion 221 is formed using a metal material and can, for example, be formed of an aluminum alloy or the like by metal spinning or pressing. Frame body 222 is formed of a hard resin material or a metal material. Frame 220 is fixed by frame body 222 being attached to pedestal 210.

Reflection plate 230 is a circular-annular-frame-shaped (funnel-shaped) reflection member having an inner surface reflection function. For example, reflection plate 230 can be formed using a metal material such as aluminum. Note that reflection plate 230 may be formed using a hard white resin material instead of a metal material.

Light-transmissive panel 240 is a light-transmissive member having light-diffusing properties and light-transmitting properties. Light-transmissive panel 240 is a flat plate disposed between reflection plate 230 and frame 220, and is attached to reflection plate 230. For example, light-transmissive panel 240 can be formed into a disc shape using a transparent resin material such as acrylic or polycarbonate.

Note that illumination apparatus 200 is not required to include light-transmissive panel 240. Without light-transmissive panel 240, illumination apparatus 200 allows an improvement in the luminous flux of light that is emitted therefrom.

Furthermore, as illustrated in FIG. 7, lighting apparatus 250 which supplies light-emitting apparatus 10 with electric power for lighting light-emitting apparatus 10, and terminal base 260 which relays AC power from a commercial power supply to lighting apparatus 250 are connected to light-emitting apparatus 10 in illumination apparatus 200. Specifically, lighting apparatus 250 converts AC power relayed by terminal base 260 into DC power, and outputs the DC power to light-emitting apparatus 10.

Lighting apparatus 250 and terminal base 260 are fixed to attachment plate 270 provided separately from the apparatus body. Attachment plate 270 is formed by folding a rectangular plate member made of a metal material, and has one longitudinal end the bottom surface of which lighting apparatus 250 is fixed to and the other longitudinal end the bottom surface of which terminal base 260 is fixed to. Attachment plate 270 is connected together with top plate 280 which is fixed to a top portion of pedestal 210 of the apparatus body.

Summary of Embodiment 2

As described above, illumination apparatus 200 includes light-emitting apparatus 10 and lighting apparatus 250 which supplies light-emitting apparatus 10 with electric power for lighting light-emitting apparatus 10. With this, illumination apparatus 200 is capable of reducing the effect the heat generated by yellow phosphor 14 emitting light has on sealing member 13.

Note that illumination apparatus 200 may include light-emitting apparatus 10a instead of light-emitting apparatus 10 or may include light-emitting apparatus 10b instead of light-emitting apparatus 10.

Other Embodiments

Although the light-emitting apparatus and the illumination apparatus according to the embodiments have been described above, the present disclosure is not limited to the above-described embodiments.

For example, the combinations of the LED chips and the phosphors included in the light-emitting apparatus are not limited to those in the above embodiments. Any combinations of the LED chips and the phosphors are applicable so long as the advantageous effects described in the present disclosure can be produced.

Furthermore, although the above embodiments describe the light-emitting apparatuses that emit white light as an example, the light-emitting apparatus in the present disclosure may be implemented as a light-emitting apparatus that emits light of a color other than white.

Furthermore, the light-emitting element is exemplified as an LED chip in the above embodiments. However, a semiconductor light-emitting element, such as a semiconductor laser, or another type of solid-state light-emitting element, such as an electroluminescence (EL) element including an organic or inorganic EL material, may be used as the light-emitting element.

Furthermore, although the illumination apparatus is exemplified as a recessed light in the above embodiment, the illumination apparatus in the present disclosure may be implemented as an illumination apparatus other than the recessed light, such as a ceiling light, a spotlight, and a base light.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting apparatus comprising:
   a substrate;
   a plurality of light-emitting elements disposed on the substrate and including a plurality of blue light-emitting diode (LED) chips which emit blue light that excites a phosphor and a plurality of red LED chips which emit red light that does not excite the phosphor; and
   a sealing member that contains the phosphor and seals the plurality of light-emitting elements together,
   wherein the plurality of light-emitting elements include: a first light-emitting element group; a second light-emitting element group disposed around the first light-emitting element group in an annular shape centered on an optical axis of the light-emitting apparatus; and a third light-emitting element group disposed around the second light-emitting element group in an annular shape centered on the optical axis,
   the phosphor is either of a yellow phosphor or a green phosphor,
   among the plurality of blue LED chips and the plurality of red LED chips, only blue LED chips are included in the first light-emitting element group,
   among the plurality of blue LED chips and the plurality of red LED chips, only red LED chips are included in the second light-emitting element group, and
   among the plurality of blue LED chips and the plurality of red LED chips, only blue LED chips are included in the third light-emitting element group.

2. The light-emitting apparatus according to claim 1, wherein the first light-emitting element group is at an innermost position among the plurality of light-emitting elements disposed on the substrate.

3. The light-emitting apparatus according to claim 1, wherein the third light-emitting element group is at an outermost position among the plurality of light-emitting elements disposed on the substrate.

4. The light-emitting apparatus according to claim 1, wherein each of the second light-emitting element group and the third light-emitting element group is disposed in a circular annular shape on the substrate, and
   the second light-emitting element group and the third light-emitting element group are disposed in concentric circles centered on the optical axis.

5. The light-emitting apparatus according to claim 1, further comprising
   a dam member that is disposed on the substrate, blocks the sealing member, and laterally surrounds the sealing member.

6. An illumination apparatus comprising:
   the light-emitting apparatus according to claim 1; and
   a lighting apparatus that supplies the light-emitting apparatus with electric power for lighting the light-emitting apparatus.

* * * * *